(12) United States Patent
Hsu et al.

(10) Patent No.: US 10,755,919 B2
(45) Date of Patent: Aug. 25, 2020

(54) METHOD OF FABRICATING SEMICONDUCTOR DEVICES WITH SAME CONDUCTIVE TYPE BUT DIFFERENT THRESHOLD VOLTAGES

(71) Applicant: UNITED MICROELECTRONICS CORP., Hsin-Chu (TW)

(72) Inventors: Chih-Kai Hsu, Tainan (TW); Ssu-I Fu, Kaohsiung (TW); Chun-Ya Chiu, Tainan (TW); Chin-Hung Chen, Tainan (TW); Chi-Ting Wu, Tainan (TW); Yu-Hsiang Lin, New Taipei (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/273,003

(22) Filed: Feb. 11, 2019

(65) Prior Publication Data

US 2019/0206672 A1 Jul. 4, 2019

Related U.S. Application Data

(62) Division of application No. 15/866,489, filed on Jan. 10, 2018, now Pat. No. 10,249,488.

(30) Foreign Application Priority Data

Jan. 3, 2018 (CN) .......................... 2018 1 0004058

(51) Int. Cl.
*H01L 21/02* (2006.01)
*H01L 21/762* (2006.01)
*H01L 29/78* (2006.01)
*H01L 21/67* (2006.01)
(Continued)

(52) U.S. Cl.
CPC ...... *H01L 21/022* (2013.01); *H01L 21/02164* (2013.01); *H01L 21/67069* (2013.01);
(Continued)

(58) Field of Classification Search
CPC ............. H01L 21/022; H01L 29/66545; H01L 21/67069; H01L 21/02164
See application file for complete search history.

(56) References Cited

U.S. PATENT DOCUMENTS 9,012,319 B1 4/2015 Choi
9,502,416 B1 * 11/2016 Kim .................... H01L 27/1116
(Continued)

*Primary Examiner* — Dung A. Le
(74) *Attorney, Agent, or Firm* — Winston Hsu

(57) ABSTRACT

A method of manufacturing semiconductor devices, including the steps of providing a substrate with a first active region, a second active region and a third active region, forming dummy gates in the first active region, the second active region and the third active region, removing the dummy gates to form trenches in the first active region, the second active region and the third active region, forming a high-k dielectric layer, a first bottom barrier metal layer on the high-k dielectric layer, a second bottom barrier metal layer on the first bottom barrier metal layer, and a first work function metal layer on the second bottom barrier metal layer in the trenches, removing the first work function metal layer from the second active region and the third active region, removing the second bottom barrier metal layer from the third region, and filling up each trench with a low resistance metal.

5 Claims, 7 Drawing Sheets

(51) Int. Cl.
| | |
|---|---|
| *H01L 29/165* | (2006.01) |
| *H01L 29/66* | (2006.01) |
| *H01L 27/088* | (2006.01) |
| *H01L 29/49* | (2006.01) |
| *H01L 21/8238* | (2006.01) |
| *H01L 27/092* | (2006.01) |
| *H01L 29/51* | (2006.01) |

(52) U.S. Cl.
CPC ...... *H01L 21/67075* (2013.01); *H01L 21/762* (2013.01); *H01L 21/76224* (2013.01); *H01L 21/823842* (2013.01); *H01L 27/088* (2013.01); *H01L 27/0922* (2013.01); *H01L 29/165* (2013.01); *H01L 29/4925* (2013.01); *H01L 29/4941* (2013.01); *H01L 29/4966* (2013.01); *H01L 29/6659* (2013.01); *H01L 29/66545* (2013.01); *H01L 29/7833* (2013.01); *H01L 29/517* (2013.01); *H01L 29/6656* (2013.01)

(56) References Cited

U.S. PATENT DOCUMENTS

| | | | |
|---|---|---|---|
| 9,530,778 B1 * | 12/2016 | Lin | H01L 27/0922 |
| 9,754,841 B2 | 9/2017 | Yang | |
| 2012/0313178 A1 * | 12/2012 | Liao | H01L 29/66545 257/368 |
| 2013/0056836 A1 | 3/2013 | Yu | |
| 2013/0161753 A1 | 6/2013 | Yoshimori | |
| 2016/0093536 A1 | 3/2016 | Yang | |
| 2016/0203988 A1 * | 7/2016 | Zhao | H01L 21/82345 257/392 |
| 2016/0268259 A1 | 9/2016 | Chang | |
| 2016/0276224 A1 | 9/2016 | Gan | |
| 2016/0315080 A1 | 10/2016 | Song | |
| 2016/0358921 A1 | 12/2016 | Park | |
| 2017/0309520 A1 | 10/2017 | Liou | |
| 2018/0005891 A1 | 1/2018 | Bao | |

* cited by examiner

METHOD OF FABRICATING SEMICONDUCTOR DEVICES WITH SAME CONDUCTIVE TYPE BUT DIFFERENT THRESHOLD VOLTAGES

CROSS REFERENCE TO RELATED APPLICATIONS

This application is a divisional of application Ser. No. 15/866,489, filed on Jan. 10, 2018 and entitled "SEMICONDUCTOR DEVICE AND METHOD OF FABRICATING THE SAME", which is incorporated herein by reference.

BACKGROUND OF THE INVENTION

1. Field of the Invention

The invention relates to a semiconductor device and a method for fabricating the same, and more particularly, to semiconductor devices with same conductive type but different threshold voltages and a method for fabricating the same.

2. Description of the Prior Art

In current semiconductor industry, polysilicon has been widely used as a gap-filling material for fabricating gate electrode of metal-oxide-semiconductor (MOS) transistors. However, conventional polysilicon gate also faced problems such as inferior performance due to boron penetration and unavoidable depletion effect which increases equivalent thickness of gate dielectric layer, reduces gate capacitance, and worsens driving force of the devices. In replacing polysilicon gates, work function metals have been developed to serve as a control electrode working in conjunction with high-K gate dielectric layers.

In a complementary metal-oxide semiconductor (CMOS) device, NMOS device and PMOS device are provided with different work function metal (WFM) layer. It is well-known that the compatibility and the process controls of the dual metal gates are more complicated than usual, whereas the thickness and the composition of the materials used in the dual metal gate method should be more precisely controlled. This situation is even stricter when the gate's critical feature (CD) of semiconductor transistor is scaled down to the level below 20 nm. Several layer elements required for constituting the metal gate transistor, including the high-K gate dielectric, bottom barrier metal, p-type work function metal, n-type work function metal, top barrier metal and gate filling metal, can't quite fit into the gate trench in such a microscopic dimension. The problem of insufficient gate trench space restricts the thickness of the work function metal layer to be disposed therein and their ability of tuning the threshold voltage ($V_{th}$).

In addition to the problem of insufficient space for filling the gate elements, the transistors with multiple threshold voltages has become more and more necessary in current integrated circuit in order to optimize the delay or power in operation. The $V_{th}$ of a MOSFET is the gate voltage where an inversion layer forms at the interfacial between the insulating layer and the substrate of the transistor. Low $V_{th}$ devices are used in the logic where fast switching speed is important. High $V_{th}$ devices connecting the power rails and virtual power rails are turned on in active mode, off in sleep mode, so that the High $V_{th}$ devices are properly used as sleep transistors to reduce static leakage power. The materials of the metal layers included in the gate transistor always affect the work function of the NMOS or the PMOS and their $V_{th}$ characteristics and consequently affect the performances of the product. Therefore, the semiconductor manufacturers are searching for new and better manufacturing method to obtain a CMOS with both the good work function performances and multi-threshold voltages characteristics under current roadmap of semiconductor development.

SUMMARY OF THE INVENTION

The following paragraphs present a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

In order to solve the issue of insufficient filling space for metal gate elements and fulfill the requirement of transistors with multi-threshold voltages characteristics, it is provided in the present invention a novel design of semiconductor transistors with same conductive type but different layer constitutions. The semiconductor transistors with multi-threshold voltages are manufactured concurrently in the same semiconductor process with individually additional process steps to form different layers for tuning the work function and achieving different threshold voltages.

In one aspect of the embodiments, there is provided a semiconductor device including the structures of a substrate, a first transistor on the substrate, wherein the first transistor includes a high-k dielectric layer, a first bottom barrier metal layer on the high-k dielectric layer, a second bottom barrier metal layer on the first bottom barrier metal layer, a work function metal layer on the second bottom barrier metal layer, and a low resistance metal on the work function metal layer, and a second transistor on the substrate, wherein the second transistor includes the high-k dielectric layer, the first bottom barrier metal layer on the high-k dielectric layer, the second bottom barrier metal layer on the first bottom barrier metal layer, and the low resistance metal on the second bottom barrier metal layer, and a third transistor on the substrate, wherein the third transistor comprises the high-k dielectric layer, the first bottom barrier metal layer on the high-k dielectric layer, and the low resistance metal on the first bottom barrier metal layer, wherein the first transistor, the second transistor and the third transistor have same conductive type but different threshold voltage.

In another aspect of the embodiments, there is provided a method of manufacturing semiconductor devices including the steps of providing a substrate with a first active region, a second active region and a third active region, forming dummy gates in the first active region, the second active region and the third active region, removing the dummy gates to form trenches in the first active region, the second active region and the third active region, forming a high-k dielectric layer, a first bottom barrier metal layer on the high-k dielectric layer, a second bottom barrier metal layer on the first bottom barrier metal layer, and a first work function metal layer on the second bottom barrier metal layer in the trenches, removing the first work function metal layer from the second active region and the third active region, removing the second bottom barrier metal layer from the third region, and filling up each trench with a low resistance metal.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

Figure 1:
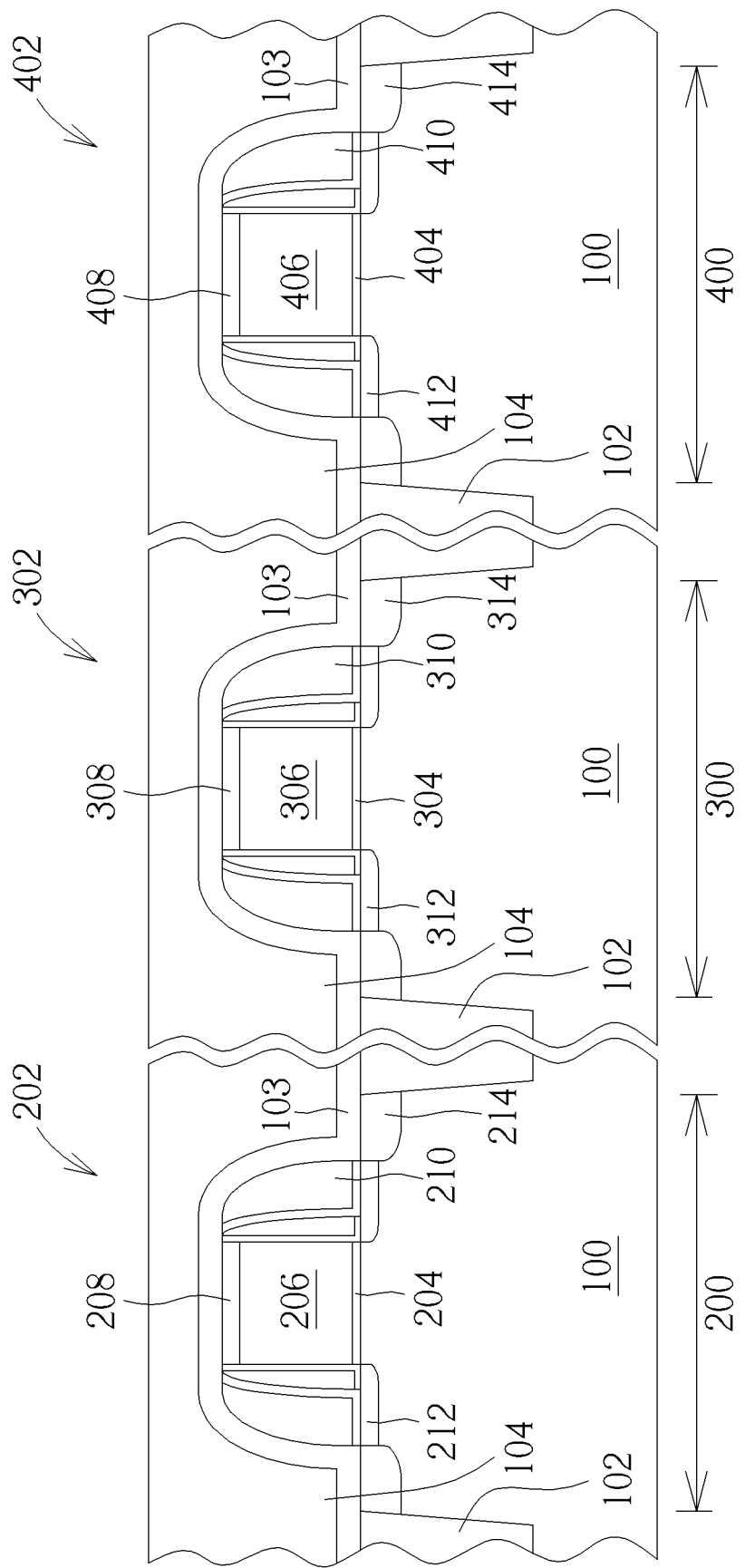
FIGS. 1-7 are cross-sectional views depicting an exemplary process flow of manufacturing semiconductor devices with same conductive type but different threshold voltages in accordance with the preferred embodiment of the present invention.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

In the following detailed description of the present invention, reference is made to the accompanying drawings which form a part hereof and is shown by way of illustration and specific embodiments in which the invention may be practiced. These embodiments are described in sufficient details to enable those skilled in the art to practice the invention. Other embodiments may be utilized and structural, logical, and electrical changes may be made without departing from the scope of the present invention. The following detailed description, therefore, is not to be taken in a limiting sense, and the scope of the present invention is defined by the appended claims.

Before describing the preferred embodiment in more detail, further explanation shall be given regarding certain terms that may be used throughout the descriptions. The term "etch" or "etching" is used herein to generally describe a fabrication process of patterning a material, such that at least a portion of the material remains after the etch is completed. For example, it should be understood that the process of etching silicon involves the steps of patterning a masking layer (e.g., photoresist or a hard mask) above the silicon, and then removing the areas of silicon no longer protected by the masking layer. As such, the areas of silicon protected by the mask would remain behind after the etch process is complete. However, in another example, etching may also refer to a process that does not use a mask, but still leaves behind at least a portion of the material after the etch process is complete. The above description serves to distinguish the term "etching" from "removing." When etching a material, at least a portion of the material remains behind after the process is completed. In contrast, when removing a material, substantially all of the material is removed in the process. However, in some embodiments, 'removing' is considered to be a broad term that may incorporate etching.

During the descriptions herein, various regions of the substrate upon which the field-effect devices are fabricated are mentioned. It should be understood that these regions may exist anywhere on the substrate and furthermore that the, regions may not be mutually exclusive. That is, in some embodiments, portions of one or more regions may overlap. Although up to three different regions are described herein, it should be understood that any number of regions may exist on the substrate and may designate areas having certain types of devices or materials. In general, the regions are used to conveniently describe areas of the substrate that include similar devices and should not limit the scope or spirit of the described embodiments.

The terms "forming," "form," "deposit," or "dispose" are used herein to describe the act of applying a layer of material to the substrate. Such terms are meant to describe any possible layer-forming technique including, but not limited to, thermal growth, sputtering, evaporation, chemical vapor deposition, epitaxial growth, electroplating, etc. According to various embodiments, for instance, deposition may be performed according to any appropriate well-known method. For instance, deposition can comprise any process that grows, coats, or transfers material onto a substrate. Some well-known technologies include physical vapor deposition (PVD), chemical vapor deposition (CVD), electrochemical deposition (ECD), molecular beam epitaxy (MBE), atomic layer deposition (ALD), and plasma-enhanced CVD (PECVD), amongst others.

The "substrate" as used throughout the descriptions is most commonly thought to be silicon. However, the substrate may also be any of a wide array of semiconductor materials such as germanium, gallium arsenide, indium phosphide and etc. In other embodiments, the substrate may be electrically non-conductive such as a glass or sapphire wafer.

FinFET (fin field-effect transistor) technology takes its name from the fact that the FET structure used looks like a set of fins when viewed. The main characteristic of the FinFET is that it has a conducting channel wrapped by a thin silicon "fin" from which it gains its name. The thickness of the fin determines the effective channel length of the device. In terms of its structure, it typically has a vertical fin on a substrate which runs between a larger drain and source area. This protrudes vertically above the substrate as a fin. This form of gate structure provides improved electrical control over the channel conduction and it helps reduce leakage current levels and overcomes some other short-channel effects.

Please refer to FIG. 1 to FIG. 7. FIG. 1 to FIG. 7 are schematic diagrams depicting an exemplary process flow of manufacturing semiconductor devices, such as fin field effect transistors (FinFET) with same conductive type but different threshold voltages according to one preferred embodiment of the present invention. It should be noted that even though the following preferred embodiment pertains to a FinFET process, it would also be desirable to apply the process of this embodiment to a planar MOS transistor, which is also within the scope of the present invention.

First, as shown in FIG. 1, a substrate 100 is provided, such as a silicon substrate, a silicon-containing substrate or a silicon-on-insulator (SOI) substrate, but is not limited thereto. For the FinFET process, the substrate 100 would be fin-shaped structures/stripes preferably obtained by a conventional sidewall image transfer (SIT) process. A plurality of shallow trench isolations (STI) 102 composed of silicon oxide are disposed on the substrate 100. According to the areas encompassed by the STI 102, a first active region 200, a second active region 300 and a third active region 400, which are insulated from each other, are defined on the substrate 100. In the preferred embodiment of the present invention, the first active region 200, a second active region 300 and a third active region 400 are defined to be formed with semiconductor devices with same conductive type but different threshold voltages thereon, such as the p-type FET (referred hereinafter as pFET) with high threshold voltage (HVT), standard threshold voltage (SVT), low threshold voltage (LVT), and ultra-low threshold voltage (uLVT). Since in current semiconductor manufacture, pFET would require larger gate trench space for the work function metals (WFM) with various thicknesses to fill in and tune both the threshold voltage of nFET (referred hereinafter as nFET) and pFET, pFET is easier to suffer insufficient gate trench space issue than the nFET, thus the transistors described in the embodiment are preferably pFET to demonstrate the advantages and purposes of the present invention.

In combination of the replacement metal gate (RMG) process, a dummy transistor 202, 302 or 402 will be first formed on each defined active region. It should be noted that the three defined active region regions are preferably transistors regions having same conductive type, such as all being PMOS regions, and they are defined to fabricate gate structures with different threshold voltages in the later process, it would be desirable to form bottom barrier metal (BBM) and/or work function metal (WFM) layer having different thickness and/or different number of layers in the regions after the dummy gates are transformed into metal gates. An optical proximity correction (OPC) process may be performed to adjust or pre-size the size of the gate trench or gate width so that the gate trench used to form gate having thicker and/or more layers of BBM layer and/or WFM layers would become relatively wider than the original gate trench size.

In one embodiment shown in FIG. 1, the first dummy transistor 202 includes a first interfacial layer 204, a first sacrificial gate 206, a first cap layer 208, first spacers 210, first lightly doped drains (LDDs) 212 and first source/drain 214. In one preferred embodiment of the present invention, the first interfacial layer 204 can be a SiO2 layer. A etch stop layer (not shown), such as TiN may be optionally formed between the first interfacial layer 204 and the first sacrificial gate 206. The first sacrificial gate 206 is a poly-silicon gate. In another embodiment, the first sacrificial gate 206 is a multi-layered gate including a poly-silicon layer, an amorphous silicon layer or a germanium layer. The first cap layer 208 is a SiN layer for example. The first spacer 210 can be a multi-layered structure including high temperature oxide (HTO), SiN, SiON, SiCN. The first LDD 212 and the first source/drain 214 are formed by appropriate dopants implantation. In some embodiments, the first interfacial layer 204 and the first etch stop layer can be omitted.

Similarly, the second dummy transistor 302 may include a second interfacial layer 304, a second sacrificial gate 306, a second cap layer 308, second spacers 310, second LDDs 312 and second source/drain 314. The components in the second transistor 302 of this embodiment are similar to those of the first transistor 202 and are therefore not described repeatedly. The third dummy transistor 402 includes a third interfacial layer 404, a third sacrificial gate 406, a third cap layer 408, a third spacer 410, a third LDD 412 and a third source/drain 414. The components in the third dummy transistor 402 of this embodiment are similar to those of the first dummy transistor 202 and are therefore not described repeatedly. It is noted that since the first active region 200, a second active region 300 and a third active region 400 are defined to be formed with semiconductor devices with different threshold voltages thereon, some components of these transistors may be different. For instance, the first source/drain 214, the second source/drain 314 and the third source/drain 414 have dopants of same conductive type, however, the implant energy and dosage thereof can be different. In addition, first dummy transistor 202, the second dummy transistor 302 and the third dummy transistor 402 may further include other semiconductor structures that are not explicitly shown in FIG. 1, such as a silicide layer, the epitaxial layer made of SiGe, SiC, or SiP formed by selective epitaxial growth (SEG), or other protective films.

After forming the first dummy transistor 202, the second dummy transistor 302 and the third dummy transistor 402, a contact etch stop layer (CESL) 102 and an inter-layer dielectric (ILD) layer 104 are formed on the substrate 300 to cover the first dummy transistor 202, the second dummy transistor 302 and the third dummy transistor 402. In one embodiment, the CESL 102 can generate different stresses in the first active region 200, the second active region 300 and the third active region 400 to form a selective strain scheme (SSS) for the first dummy transistor 202, the second dummy transistor 302 and the third dummy transistor 402, respectively.

Figure 2:
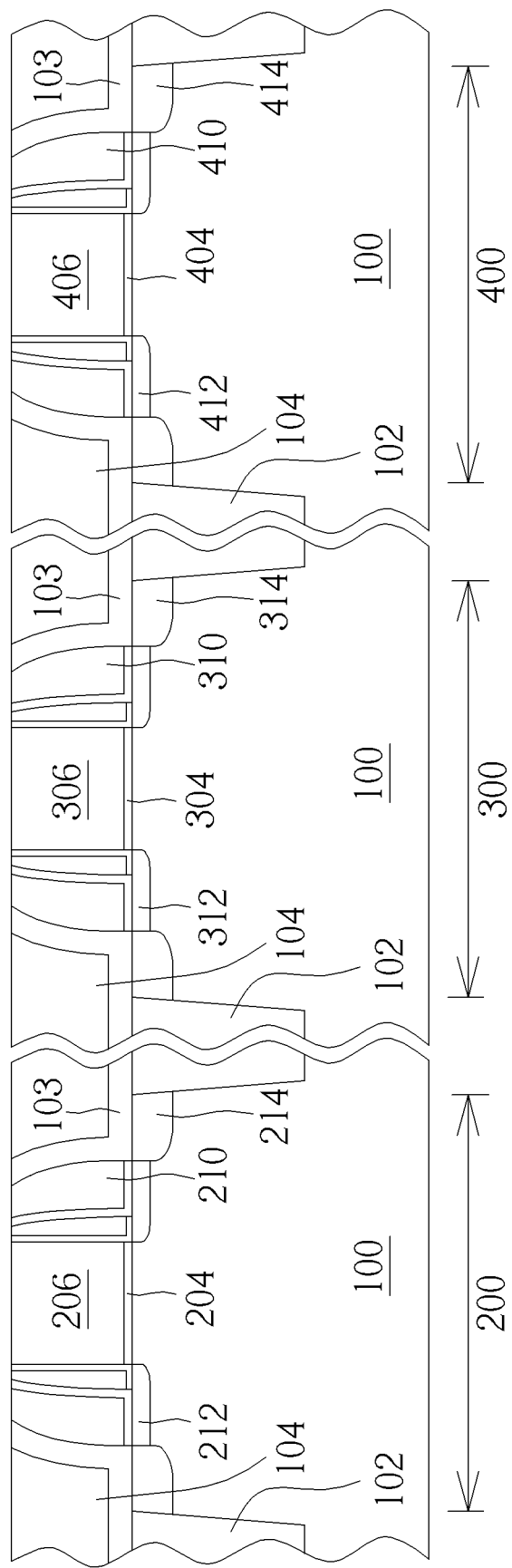

Please refer now to FIG. 2. a planarization process, such as a chemical mechanical polish (CMP) process or an etching-back process or combination thereof is performed to remove a part of the ILD layer 104, a part of the CESL 102, a part of the first spacer 210, a part of the second spacer 310, apart of the third spacer 410 and completely remove the first cap layer 208, the second cap layer 308 and the third cap layer 408, until the first sacrificial gate 206, the second sacrificial gate 306 and the third sacrificial gate 406 composed of poly-silicon are exposed.

Figure 3:
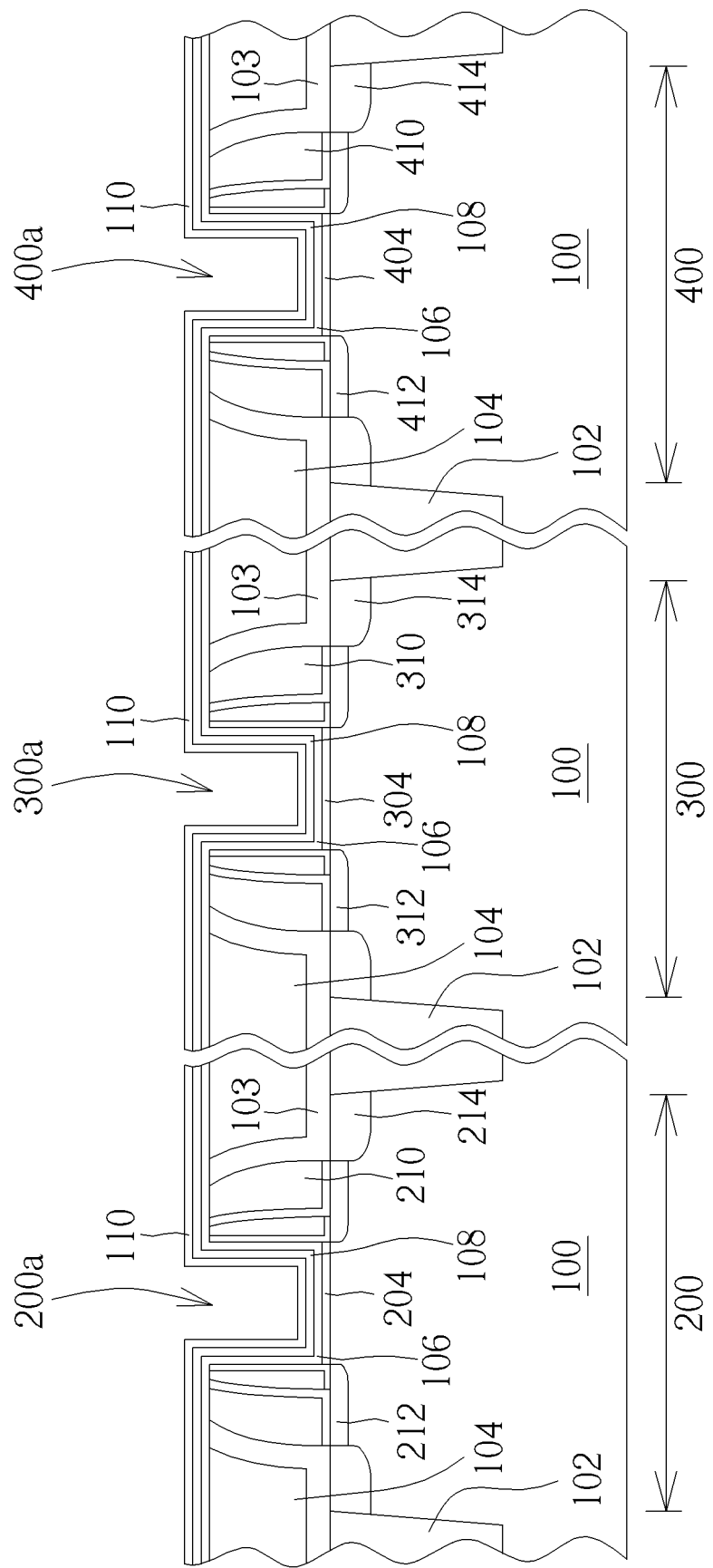

Please refer to FIG. 3. After first sacrificial gate 206, the second sacrificial gate 306 and the third sacrificial gate 406 are exposed, a replacement metal gate (RMG) process is conducted to transform the dummy gates into metal gates. For instance, a selective dry etching or wet etching process may be conducted by using etchant including ammonium hydroxide ($NH_4OH$) or tetramethyl ammonium hydroxide (TMAH) to remove the first sacrificial gate 206, the second sacrificial gate 306 and the third sacrificial gate 406 until the first interfacial layer 204, the second interfacial layer 304 and the third interfacial layer 404 are exposed. Gate trenches 200a, 300a and 400a are therefore formed respectively on the active region 200, 300 and 400 as the filling space for metal gates. In some embodiment, the etch process removing the sacrificial gates may also remove the interfacial layer 204, 304, 404. It should be noted that since the dummy gates on the substrate may have different sizes, the gate trenches 200a, 300a and 400a formed after removing the dummy gates may also have different sizes.

Please refer again to FIG. 3. After the gate trenches are formed, a high-k dielectric layer 106 is formed comformally on the surface of the substrate and the gate trenches. The high-k dielectric layer 106 has a dielectric constant greater than 4, and the material thereof includes rare earth metal oxides or lanthanide oxides, such as hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), lanthanum aluminum oxide (LaAlO), tantalum oxide ($Ta_2O_5$), zirconium oxide ($ZrO_2$), zirconium silicon oxide ($ZrSiO_4$), hafnium zirconium oxide (HfZrO), yttrium oxide ($Yb_2O_3$), yttrium silicon oxide (YbSiO), zirconium aluminate (ZrAlO), hafnium aluminate (HfAlO), aluminum nitride (AlN), titanium oxide ($TiO_2$), zirconium oxynitride (ZrON), hafnium oxynitride (HfON), zirconium silicon oxynitride (ZrSiON), hafnium silicon oxynitride (HfSiON), strontium bismuth tantalite ($SrBi_2Ta_2O_9$, SBT), lead zirconate titanate ($PbZr_xTi_{1-x}O_3$, PZT) or barium strontium titanate ($BaXSr_{1-x}TiO_3$, BST), but is not limited thereto.

Refer still to FIG. 3. After the high-k dielectric layer 106 is formed, a first bottom barrier metal (BBM) layer 108 and a second BBM layer 110 are formed comformally and successively along the surface of the high-k dielectric layer 106 on each active region. The BBM layers 108 and 110 act as a barrier for protecting either one of the metals at both sides from corrupting the other due to the thermal diffusion or electro-migration. The material of the two BBM layer may include titanium (Ti), titanium nitride (TiN), tantalum (Ta), tantalum nitride (TaN) or tungsten nitride (WN). In the preferred embodiment wherein the predetermined transistors are p-type transistors, the first BBM layer 108 is titanium nitride (TiN) and the second BBM layer 110 is tantalum nitride (TaN). The first BBM layer 108 and the second BBM layer 110 may have different thickness.

Figure 4:
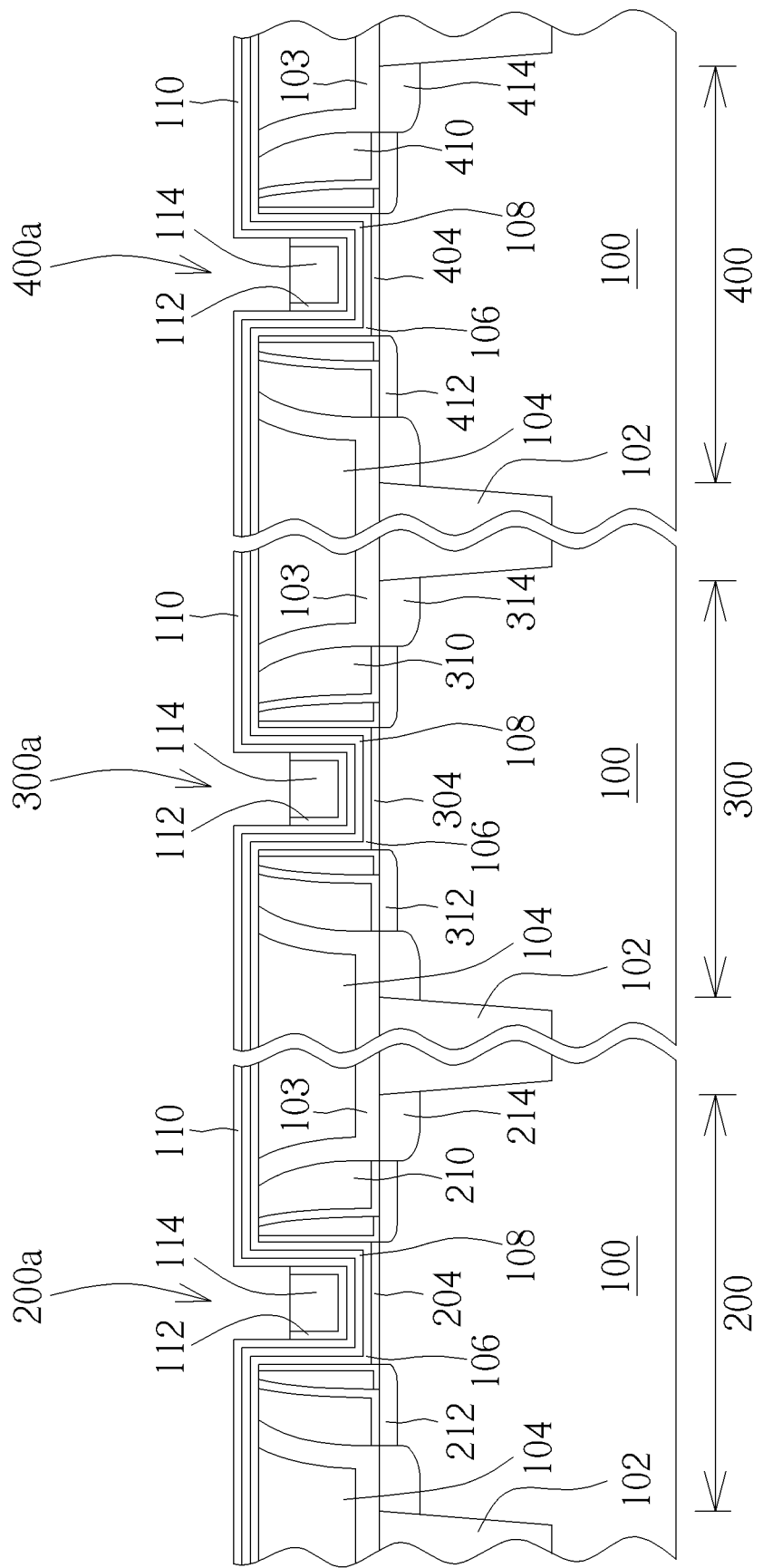

Please refer now to FIG. 4. After the high-k dielectric layer 106, the first BBM layer 108 and a second BBM layer 110 are formed, a work function metal layer (referred hereinafter as PWFM layer) 112 for tuning the threshold voltage of the pFET is formed conformally along the surface of the second BBM layer 110. The PWFM layer 112 may have a thickness ranging from about 5 angstroms to about 10 angstroms. For pFET devices, the work function metal layer should have a work function ranging between 4.8 eV and 5.2 eV. The adequate material of the PWFM layer 112 in this eV range may include, but not be limited to, titanium nitride (TiN), ruthenium (Ru), iridium (Ir), platinum (Pt), tungsten nitride (WN), molybdenum nitride ($Mo_2N$), tantalum nitride (TaN), tantalum carbide (TaC), but it is not limited thereto.

In the semiconductor transistor whose gate critical dimension (CD) is scaled down to the level below 20 nm, the PWFM layer 112 together with the high-k dielectric layer 106 and the BBM layer 108 and 110 would occupy a lot of space in the originally narrow gate trench. This will make other gate components more difficult to be filled into the trench in later processes. In order to make room for these gate components, a pull-down process is performed to remove the portion of the PWFM layer 112 above a predetermined level in the trench. This pull-down process may include the step of filling a mask 114 on the PWFM layer 112 in the gate trench. The surface of the mask 114 is controlled at a predetermined level. After the mask 114 is filled, an etch process is performed to remove the PWFM layer 112. In this etch process, the portion of PWFM layer 112 above the predetermined level of the mask 114 is removed so that only a U-shaped portion of the PWFM layer 112 remains in the gate trench. The pull-down of the PWFM layer 112 may be carried out in a selective directional etching process, such as a reactive-ion-etching (RIE) process that may be made and/or chemically adjusted to be selective to material of PWFM layer 112. As a result of this selective etching process, only the unnecessary portion of PWFM layer 112 may be etched away and the underlying BBM layer 110 remains intact or substantially intact. The removal of a portion of the PWFM layer 112 above the predetermined level would increase the size of the trench opening and allow other gate components, such as the n-type work function metals and low resistance metal to be more easily filled into the trench in later process.

Figure 5:
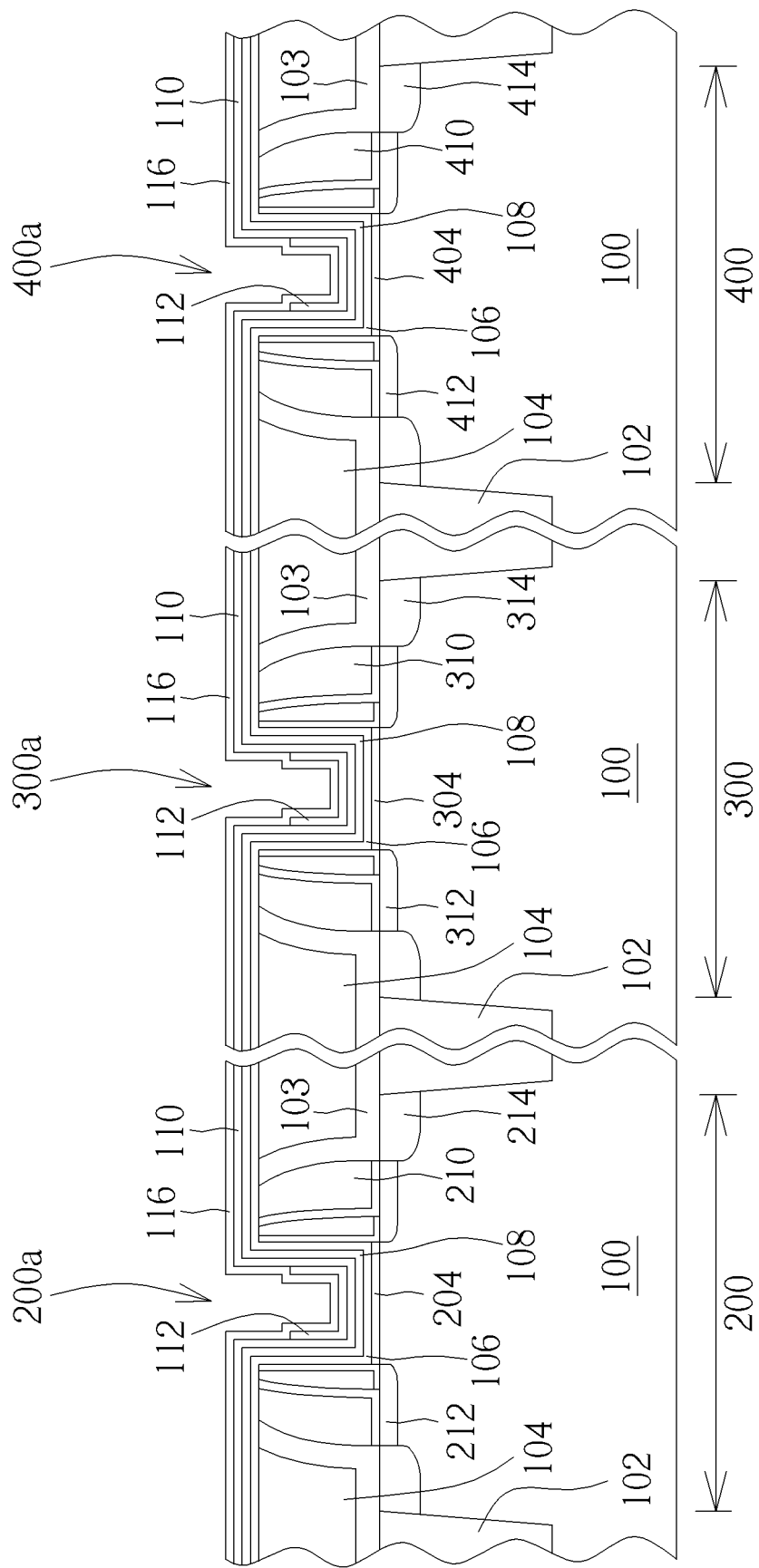

Please refer now to FIG. 5. After the U-shaped PWFM layer 112 is formed, the mask 114 will be stripped out to expose the surface of the PWFM layer 112. A n-type work function metal layer (referred hereinafter as NWFM layer) 116 for tuning the threshold voltage of the nFET is then formed conformally along the surface of the U-shaped PWFM layer 112 and the second BBM layer 110. Since the opening of the gate trench is broaden by the removal of the upper portion of the PWFM layer 112 in previous steps, the NWFM layer 116 is ready to be formed in the gate trench.

Please note that, since the present invention is dedicated to solve the problem of insufficient filling space for pFET gate component and demonstrating the characteristics of pFETs with different threshold voltages, the nFETs device will not be shown in the drawing for the simplicity and clarity of the disclosure. The NWFM layer 116 formed in this process is just to emphasize that the pFET and nFET devices may be manufactured simultaneously in the same process flow in the present invention. In some embodiments, the NWFM layer 116 may have a thickness ranging from about 5 angstroms to about 10 angstroms. For nFET devices, the work function metal layer should have a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but it is not limited thereto.

Figure 6:
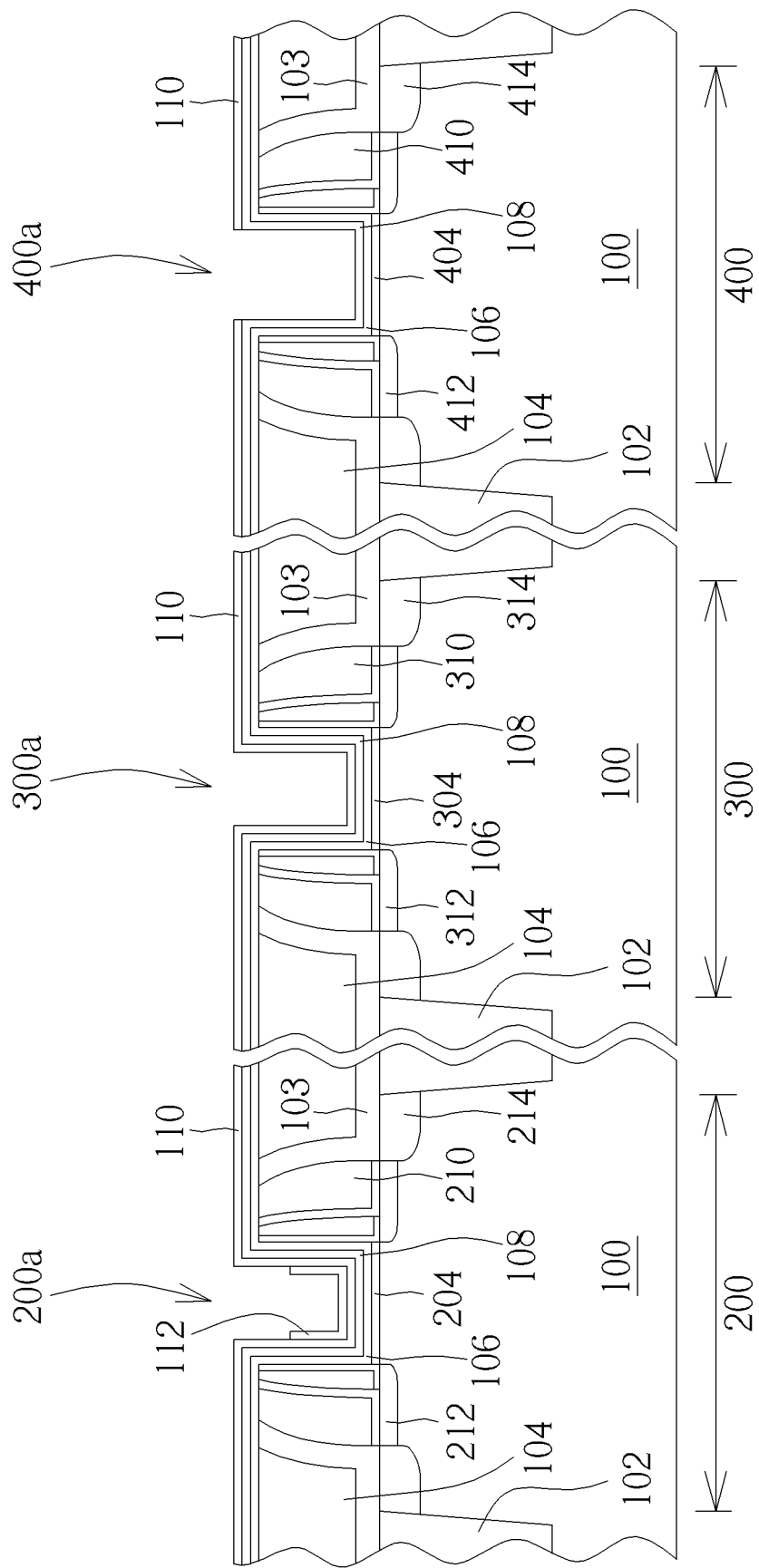

Please refer now to FIG. 6. After the U-shaped PWFM layer 112 and the NWFM layer 116 are formed, each predefined active region 200, 300 and 400 will be performed individually with different processes to change the gate components predetermined to be disposed in the regions and render them with the characteristics of different threshold voltages. In the preferred embodiment, the active regions 200, 300 and 400 are defined as the SVT, LVT and uLVT areas, respectively. First, as the NWFM layer 116 is only necessary in nFET region (not shown), the NWFM layer 116 on the pFET active region 200, 300 and 400 should be completely removed. This process may include the steps of coating all nFET regions with a photoresist as an etch mask and then performing a selective etch process to remove the NWFM layer 116 on the pFET active region. After the NWFM layer 116 is removed, the U-shaped PWFM layers 112 are exposed in each pFET active region 200, 300 and 400.

In the preferred embodiment of the present invention, since the active region 200 is defined as a region for the pFET with standard threshold voltage, the U-shaped PWFM layer 112 is necessary in this region for tuning the standard threshold voltage. While the active region 300 and the active region 400 are defined as regions for transistors with low threshold voltage and ultra low threshold voltage, they will need more trench space to tune the low voltage. For the purpose described above, the U-shaped PWFM layer 112 in the active region 300 and the active region 400 should be removed. This process may include the steps of coating the active regions 200 with a photoresist as an etch mask and then performing a selective etch process to remove the PWFM layer 112 on the active regions 300 and 400. After the PWFM layer 112 is removed, the second (upper) BBM layer 110 are completely exposed in the active region 300 and 400, while the U-shaped PWFM layer 112 still remains in the active region 200.

Though the PWFM layer 112 is removed from the active region 300 and the active region 400, the active region 400 still need more trench space in order to tuning ultra-low threshold voltage compared to the one of active region 300. For the purpose described above, another process may be performed to remove the second (upper) BBM layer 110 in the gate trench 400a of the active region 400. This process may include the steps of coating the active regions 200 and 300 with a photoresist as an etch mask and then performing a selective etch process to remove the second BBM layer 110 in the gate trench 400a of the active region 400. The second BBM layer 110 outsides of the gate trench 400a in the active region 400 may not be removed. The key point is to make more room in the gate trench for voltage tuning.

In the case of the active region 300 for LVT and the active region 400 for uLVT, it should be noted that the second BBM layer 110 and the first BBM layer 108 may be preferably made of tungsten nitride (WN), but not limited thereto. In the embodiment of the present invention, the WN-based BBM layers 108 or 110 may also acts as a work function layer with work function about 5 eV, which is an excellent work function characteristic for the low threshold voltage devices. This is the reason why the U-shaped PWFM layer 112 of the present invention is not required in the active regions 300 or the active regions 400, since the BBM layer can achieve both the functions of diffusion barrier and work function tuning in the device. For the active region 400 with more trench space, the work function can be tuned even lower to the level of uLVT by forming thicker WN-based first (lower) BBM layer 108. In the embodiment of the present invention, the wider trench space provides more tuning window for the active regions 400.

Figure 7:
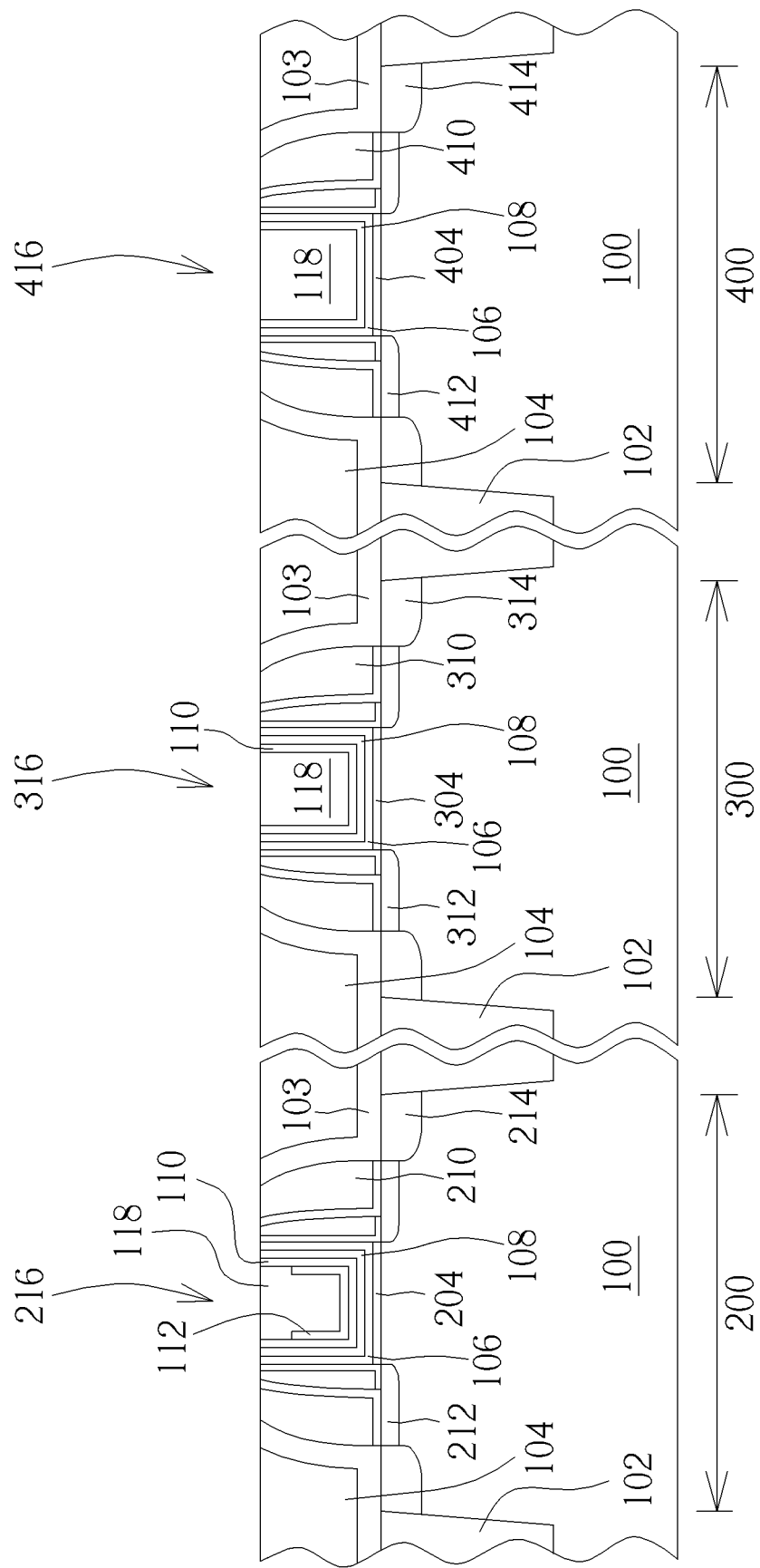

Please now refer to FIG. 7. After the gate components for tuning work functions are prepared individually for each active region, a low resistance metal 118 is formed filling up each gate trench, and a planarizing process, such as CMP, is conducted to remove the portion of the low resistance metal 118, the second BBM layer 110, the first BBM layer 108 and the high-k dielectric layer 106 outsides the gate trench. The transistor 216, 316 and 416 with different threshold voltages are therefore formed respectively in the active region 200, 300 and 400. The material of low resistance metal 118 may include Al, Ti, Ta, W, Nb, Mo, TiN, TiC, TaN, Ti/W or Ti/TiN, but is not limited thereto.

Conventionally, there will be a top barrier metal (TBM, now shown) formed between the low resistance metal and the underlying work function metal layer to prevent the diffusive corruption therebetween. However, in the case that the metal gates 302 and 402 is not provided with regular work function layer, and instead, using the WN-based BBM layer as a work function metal layer, the TBM may not be required in the metal gates 302 and 402.

Since the transistor 216, 316 and 416 have different structures, they can exhibit different electrical performance. In detail, the transistor 216 has the largest threshold voltage (SVT), the transistor 316 has the middle one and the transistor 416 has the smallest one. In one embodiment, the threshold voltage of the transistor 216 is about 0.3V to 0.6V, the threshold voltage of the transistor 316 is about 0.2V to 0.3V, and the threshold voltage of the transistor 416 is about 0.1V to 0.2V.

In summary, the present invention provides a semiconductor structure having plural transistors and the forming method. It is featured that the formed transistors have same conductive type but with different gate components. For example, in the preferred embodiment, the semiconductor device includes a first transistor 216, a second transistor 316, and a third transistor 416. The first transistor 216 includes a high-k dielectric layer 106, a first bottom barrier metal layer 108 on the high-k dielectric layer 106, a second bottom barrier metal layer 110 on the first bottom barrier metal layer 108, and a work function metal layer 112 on the second bottom barrier metal layer 110, and a low resistance metal 118 on the work function metal layer 112. The second transistor 316 includes the high-k dielectric layer 106, the first bottom barrier metal layer 108 on the high-k dielectric layer 106, the second bottom barrier metal layer 110 on the first bottom barrier metal layer 108, and the low resistance metal 118 on the second bottom barrier metal layer 110. The third transistor 416 includes the high-k dielectric layer 106, the first bottom barrier metal layer 108 on the high-k dielectric layer 106, and the low resistance metal 118 on the first bottom barrier metal layer 108. Due to the different gate components, the electrical performance of the transistors may be individually tuned and provides them with the characteristic of different threshold voltages.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of manufacturing semiconductor devices, comprising the steps of:
   providing a substrate with a first active region, a second active region and a third active region;
   forming dummy gates in said first active region, said second active region and said third active region;
   removing said dummy gates to form trenches in said first active region, said second active region and said third active region;
   forming a high-k dielectric layer, a first bottom barrier metal layer on said high-k dielectric layer, a second bottom barrier metal layer on said first bottom barrier metal layer, and a first work function metal layer on said second bottom barrier metal layer in said trenches;
   removing said first work function metal layer from said second active region and said third active region;
   removing said second bottom barrier metal layer from said third region; and
   filling up each said trench with a low resistance metal.

2. The method of manufacturing semiconductor devices of claim 1, further comprising performing an etch process to remove a portion of said first work function metal layer so that said first work function metal layer is in U-shape.

3. The method of manufacturing semiconductor devices of claim 2, further comprising forming a second work function metal layer on said U-shaped first work function metal layer, wherein said second work function metal layer and said first work function metal layer is for transistors with different conductive types.

4. The method of manufacturing semiconductor devices of claim 3, further comprising removing said second work function metal layer on said first active region, said second active region and said third active region.

5. The method of manufacturing semiconductor devices of claim 1, further comprising performing a chemical mechanical polishing process to remove said high-k dielectric layer, said first bottom barrier metal layer, said second bottom barrier metal layer outside said trenches.

* * * * *